United States Patent
Kishino et al.

(10) Patent No.: US 7,045,871 B2
(45) Date of Patent: May 16, 2006

(54) II-VI COMPOUND SEMICONDUCTOR CRYSTAL AND PHOTOELECTRIC CONVERSION DEVICE

(75) Inventors: Katsumi Kishino, 1782, Kusabana, Akiruno-shi, Tokyo 197-0802 (JP); Ichiro Nomura, Urayasu (JP); Song-Bek Che, Tokyo (JP); Kenji Sato, Takasaki (JP)

(73) Assignees: Nikko Materials Co., Ltd., Tokyo (JP); Katsumi Kishino, Tokyo ( * ) Notice: Subject to any disclaimer, the term of this patent is extended or adjusted under 35 U.S.C. 154(b) by 0 days.

(21) Appl. No.: 11/115,182

(22) Filed: Apr. 27, 2005

(65) Prior Publication Data

US 2005/0189553 A1  Sep. 1, 2005

Related U.S. Application Data

(62) Division of application No. 10/381,880, filed as application No. PCT/JP02/07890 on Aug. 2, 2002, now Pat. No. 6,933,519.

(30) Foreign Application Priority Data

Aug. 10, 2001 (JP) .............................. 2001-244008

(51) Int. Cl.
*H01L 31/272* (2006.01)

(52) U.S. Cl. .................... 257/442; 257/22; 257/14; 257/94

(58) Field of Classification Search ................ 257/442, 257/428, 22, E21.068, 14, 94
See application file for complete search history.

(56) References Cited

U.S. PATENT DOCUMENTS

| 4,695,857 | A | * | 9/1987 | Baba et al. ..................... 257/22 |
| 5,274,269 | A | * | 12/1993 | DePuydt et al. ............. 257/744 |
| 5,396,103 | A | | 3/1995 | Oiu et al. |
| 5,783,838 | A | * | 7/1998 | Kyozuka et al. .............. 257/21 |
| 6,031,244 | A | | 2/2000 | Noguchi et al. |
| 6,057,559 | A | | 5/2000 | Cheng et al. |

FOREIGN PATENT DOCUMENTS

| JP | 9-97802 A | 4/1997 |
| JP | 2000-150961 A | 5/2000 |
| JP | 2001-19599 A | 1/2001 |

* cited by examiner

*Primary Examiner*—Kenneth Parker
*Assistant Examiner*—Sean Fletcher
(74) *Attorney, Agent, or Firm*—Birch, Stewart, Kolasch & Birch, LLP

(57) ABSTRACT

Since a ZnTe-base compound semiconductor crystal was designed so as to have, on a ZnTe-base compound semiconductor layer, an n-type contact layer which includes a superlattice layer having n-type CdSe and n-type ZnTe grown with each other or a ZnCdSeTe-graded layer, it was made possible to raise carrier concentration of the n-type contact layer, and to control the conductivity type in a relatively easy manner.

Moreover, formation of a CdSe/ZnTe superlattice layer or a ZnCdSeTe-graded layer between the contact layer and an electrode can prevent electric resistance from being increased due to difference in the energy gaps. Since CdSe and ZnTe, composing the CdSe/ZnTe superlattice or ZnCd-SeTe composition-graded layer, have relatively close lattice constants, formation thereof is less likely to adversely affect the crystallinity of the semiconductor crystal, which is advantageous in obtaining the semiconductor crystal with an excellent quality.

2 Claims, 2 Drawing Sheets

II-VI COMPOUND SEMICONDUCTOR CRYSTAL AND PHOTOELECTRIC CONVERSION DEVICE

This application is a Divisional of application Ser. No. 10/381,880 now U.S. Pat. No. 6,933,519 filed on Mar. 31, 2003 and for which priority is claimed under 35 U.S.C. § 120. Application Ser. No. 10/381,880 is the national phase of PCT International Application No. PCT/JP02/07890 filed on Aug. 2, 2002 under 35 U.S.C. § 371. The entire contents of each of the above-identified applications are hereby incorporated by reference. This application also claims priority of Application No. 2001-24408 filed in Japan on Aug. 10, 2001 under 35 U.S.C. § 119.

TECHNICAL FIELD

The present invention relates to a II-VI compound semiconductor crystal having a semiconductor layer and a contact layer, and a photoelectric conversion device using the same as a base material.

BACKGROUND ART

Among various compound semiconductors, II-VI compound semiconductor has a particularly wide band gap and is capable of emitting typically yellow, green and blue lights. Recent efforts are thus directed to development of photoelectric conversion device using a II-VI compound semiconductor crystal as a base material and having a high efficiency and long life time.

While it is necessary that, in order to fabricate photoelectric conversion device with a high efficiency, semiconductor can arbitrarily be controlled into both conductivity types of n-type and p-type, it is known to be difficult to control the conductivity type of II-VI compound semiconductor in general. For example, it is relatively easy to control ZnSe-base compound semiconductor so as to have n-type conductivity and low resistance, but it is difficult to control it so as to have p-type conductivity. On the contrary, ZnTe-base compound semiconductor can be controlled to p-type in a relatively easy manner, but is difficult to be controlled to n-type.

It is to be noted now that ZnSe-base compound semiconductor refers to semiconductors including any compound semiconductors which can substantially establish lattice matching with ZnSe, and ZnTe-base compound semiconductor similarly refers to semiconductors including any compound semiconductors which can substantially establish lattice matching with ZnTe.

In general, ZnSe-base compound semiconductor crystal used for photoelectric conversion device contains a p-type ZnSe layer formed by the molecular beam epitaxy in which highly reactive activated nitrogen excited in plasma is irradiated into ZnSe at a high dose, where thus-obtained p-type ZnSe layer is used as a contact layer for ensuring contact with an electrode.

It has, however, been difficult for the ZnSe-base compound semiconductor to achieve a high concentration of p-type carrier, and as a consequence it has been impossible to sufficiently lower contact resistance between a p-type electrode and the p-type ZnSe contact layer. For this reason, photoelectric conversion deivces using the ZnSe-base compound semiconductor crystal having a p-n junction therein have been suffering from problems of higher operation voltage, larger power consumption, and accelerated deterioration of the devices due to generated heat.

There was thus proposed a photoelectric conversion device having a ZnTe layer, which could accept a larger dose of p-type impurity, formed on the p-n junction of ZnSe-base compound semiconductor, making use of the ZnTe layer as a contact layer with a p-type electrode. The device was, however, unsuccessful in lowering of the operation voltage since the ZnTe layer directly stacked on the ZnSe layer undesirably raised electric resistance due to a large energy gap at the interface therebetween.

There were also developed a photoelectric conversion device using a crystal having a layer structure which comprised a ZnSe layer, a ZnSeTe composition-graded layer formed thereon and having a compositional ratio of Se and Te gradually varied, and a p-type ZnTe contact layer formed further thereon; and a photoelectric conversion deivce using a crystal having a layer structure which comprised a ZnSe layer, a ZnSe/ZnTe superlattice layer formed thereon, and a p-type ZnTe contact layer formed further thereon, which were aimed at lowering the operation voltage.

It is, however, difficult to ensure an excellent crystallinity for the above-described crystals having the layer structures containing the ZnSeTe composition-graded layer or the ZnSe/ZnTe superlattice layer due to a large difference in the lattice constant between ZnTe and ZnSe, which disadvantageously exerts adverse effects on the characteristics of the photoelectric conversion deivces. Although the photoelectric conversion devices using ZnSe-base compound semiconductor crystals having the above-described layer structures have already been put into practical use, they are failing in sufficiently lowering the operation voltage, and they are far from being fully improved in the power consumption and device deterioration.

On the other hand, not so much efforts have been directed to development of the photoelectric conversion deivces using ZnTe-base compound semiconductor due to difficulty in growing ZnTe single crystals. The present inventors have, however, recently succeeded in growing p-type ZnTe single crystals, which has broken a way to stable procurement of the p-type ZnTe single crystal substrate. This has promoted a wide movement towards development of the photoelectric conversion devices using the ZnTe-based compound semiconductor.

The ZnTe compound semiconductor crystal used as a base material for the photoelectric conversion device generally has any of layer structures described below.

One example of the layer structure is obtained by placing a group XIII (IIIB) element on the surface of the p-type ZnTe substrate, and allowing the group XIII (IIIB) element to diffuse by annealing into the substrate as an n-type impurity so as to form a ZnTe layer.

Another example of the layer structure is obtained by forming an n-type ZnTe thin film by the epitaxial growth method on the p-type ZnTe substrate.

Still another example of the layer structure is obtained by sequentially forming on the p-type ZnTe single-crystalline substrate a p-type ZnTe buffer layer, a p-type clad layer comprising a quaternary mixed crystal containing Mg, Cd, Se or the like, which is typified by MgZnSeTe and CdZnSeTe, a ZnTe active layer, and an n-type clad layer comprising a quaternary mixed crystal.

It has, however, been difficult for the ZnTe-base compound semiconductor to achieve a high concentration of n-type carrier, and as a consequence it has been impossible to sufficiently lower contact resistance between an n-type electrode and the n-type ZnTe layer. For this reason, photoelectric conversion deivces using the ZnTe-base compound semiconductor crystal have been suffering from problems of higher operation voltage, larger power consumption, and accelerated deterioration of the devices due to generated heat.

That is, the carrier concentration in the n-type semiconductor layers (n-type ZnTe layer, n-type clad layer comprising a quaternary mixed crystal) in the above-described layer structure can be raised only to as high as $10^{17}/cm^{-3}$, which is not a level of carrier concentration capable of establishing ohmic contact, and it is thus difficult to lower the contact resistance. Therefore the photoelectric conversion devices using the ZnTe-base compound semiconductor crystal having a p-n junction have not reached a level suitable for the practical use, and there are no reported cases succeeded in lowering of the operation voltage.

The present invention is therefore completed so as to solve the foregoing problems, and is to provide a II-VI compound semiconductor crystal having a contact layer which can be controlled to a desired conductivity type, and a photoelectric conversion device using thereof as a base material.

DISCLOSURE OF THE INVENTION

The present inventors have studied whether a technique used for the foregoing ZnSe-base compound semiconductor, that is, a technique for using a ZnTe layer as a p-type contact layer for the ZnSe-base compound semiconductor, is applicable also to a photoelectric conversion device using a ZnTe-base compound semiconductor crystal as a base material or not. In other words, the present inventors examined use of a Se-base compound semiconductor, which can readily be controlled so as to have n-type conductivity, as an n-type contact layer for the ZnTe-base compound semiconductor. We have thus reached a conclusion that CdSe not only can have a carrier concentration raised readily as high as $10^{19}$ cm$^{-3}$ by addition of a group XVII (VIIB) element such as Cl (chlorine) or a group XIII (IIIB) element such as Al (aluminum), but is also optimum as an n-type contact layer for the ZnTe-base compound semiconductor also in view of crystallinity since the lattice constant thereof is 6.05 Å which is close to that of ZnTe (6.10 Å)

Considering the fact that direct growth of a CdSe layer on a ZnTe layer increases electric resistance due to a large energy gap at the interface therebetween, the present inventors also found out that formation of a ZnTe/CdSe superlattice layer or a ZnCdSeTe composition-graded layer between an n-type ZnTe layer and an n-type CdSe contact layer can moderate a slope of the energy gap, which successfully avoids the problem of increase in the electric resistance.

It was also known for ZnSe-base compound semiconductor that formation of a ZnSe/ZnTe superlattice layer or a ZnSeTe composition-graded layer between a ZnSe layer and a p-type ZnTe contact layer was very likely to adversely affect the crystallinity due to a large difference between the lattice constants of ZnTe and ZnSe, but present inventors found out that formation of the ZnTe/CdSe superlattice or ZnCdSeTe composition-graded layer was less likely to affect the crystallinity since the lattice constants of ZnTe and CdSe were relatively close to with each other.

It is to be noted now that an idea of forming the ZnTe/CdSe superlattice layer or a ZnCdSeTe composition-graded layer so as to control the conductivity type of the control layer is supposed to be effective not only for n-type control of ZnTe-base compound semiconductor, but also for p-type control of CdSe-base compound semiconductor.

The present invention is completed based on the above findings, and is to provide a II-VI compound semiconductor crystal designed so as to have, on a ZnTe-base compound semiconductor layer, a superlattice layer having n-type CdSe and n-type ZnTe stacked with each other or a ZnCdSeTe composition-graded layer. The present invention is also to provide a II-VI compound semiconductor crystal designed so as to have, on a CdSe-base compound semiconductor layer, a superlattice layer having p-type CdSe and p-type ZnTe stacked with each other or a ZnCdSeTe composition-graded layer.

This makes it possible in a relatively easy manner to control conductivity type of the contact layer for II-VI compound semiconductor, conductivity of which has been thought to be difficult. In other words, carrier concentration in the contact layer can readily be raised. Therefore, a semiconductor device using such semiconductor crystal as a base material can achieve ohmic contact between the contact layer and the electrode, which successfully lowers operation voltage of the semiconductor device.

For example, there can be provided a photoelectric conversion device comprising a ZnTe-base compound semiconductor crystal including a p-n junction and having an electrode respectively on the top surface and back surface thereof, and being designed so as to have an n-type contact layer between an n-type semiconductor layer and an n-type electrode, where at least a part of the n-type contact layer being comprised of a superlattice layer having n-type CdSe and n-type ZnTe stacked with each other.

More specifically, in the ZnTe-base compound semiconductor crystal, the n-type CdSe/n-type ZnTe supperlattice layer is formed on the n-type ZnTe layer, where the n-type CdSe layer is used as a layer brought into contact with the n-type electrode. In this case, the n-type CdSe layer brought into contact with the n-type electrode is preferably added with a group XVII (VIIB) element such as Cl or with a group XIII (XIIIB) element such as Al so as to raise the carrier concentration thereof to as high as $10^{18}$ cm$^{-3}$ or above, and more preferably to as high as $10^{19}$ cm$^{-3}$ or above.

According to such a photoelectric conversion device, ohmic contact between the n-type electrode and n-type contact layer can be achieved by virtue of a large carrier concentration of the n-type contact layer, and the electric resistance thereof is successfully prevented from being increased due to difference in the energy gaps since formation of the ZnTe/CdSe superlattice layer or the ZnCdSeTe composition-graded layer can moderate a slope of the energy gap. Moreover, the photoelectric conversion device is adjustable so as to have an operation voltage of 4 V or below, which raises expectation towards practical use of a photoelectric conversion device using the ZnTe-base compound semiconductor as a base material.

For the case where the contact layer is formed based on the ZnTe/CdSe superlattice structure, difference in the energy gaps can be suppressed by varying ratio of thickness of ZnTe and CdSe within the superlattice in a step-wise manner. In one example, on a ZnTe-base compound semiconductor layer, ZnTe layers having an almost constant thickness and CdSe layers having a step-wisely increased thickness can alternately be grown to thereby form the superlattice layer. It is preferable herein that the thickness of the ZnTe layers is kept unchanged within a range from 1 nm to 50 nm, and the thickness of the CdSe layers is increased in several steps from 0.2 nm to 20 nm or around up to as close as the thickness of the ZnTe layers.

Since CdSe and ZnTe, composing the CdSe/ZnTe superlattice layer or the ZnCdSeTe composition—graded layer, have relatively close lattice constants, the CdSe/ZnTe superlattice layer or the ZnCdSeTe composition-graded layer is less likely to exert adverse effects on the crystallinity of the ZnTe-base compound semiconductor crystal. The photoelectric conversion device with an excellent emission characteristic can thus be obtained.

As for the photoelectric conversion device comprising a CdSe-base compound semiconductor crystal including at least a p-n junction and having an electrode respectively on the top surface and back surface thereof, it is preferably designed so as to have a p-type contact layer between a p-type semiconductor layer and a p-type electrode, and so that at least a part of the p-type contact layer is comprised of a superlattice layer having p-type CdSe and p-type ZnTe stacked with each other or a ZnCdSeTe composition-graded layer.

For example, the present invention can form a p-type contact layer having a high carrier concentration on a CdSe-base compound semiconductor, which is generally difficult to be controlled so as to have p-type conductivity, and can ensure ohmic contact between the p-type electrode and the p-type contact layer, which is successful in lowering the operation voltage of the photoelectric conversion device.

PREFERRED EMBODIMENT OF THE INVENTION

Preferred embodiment of the present invention will be detailed with reference to the accompanying drawings.

Figure 1:
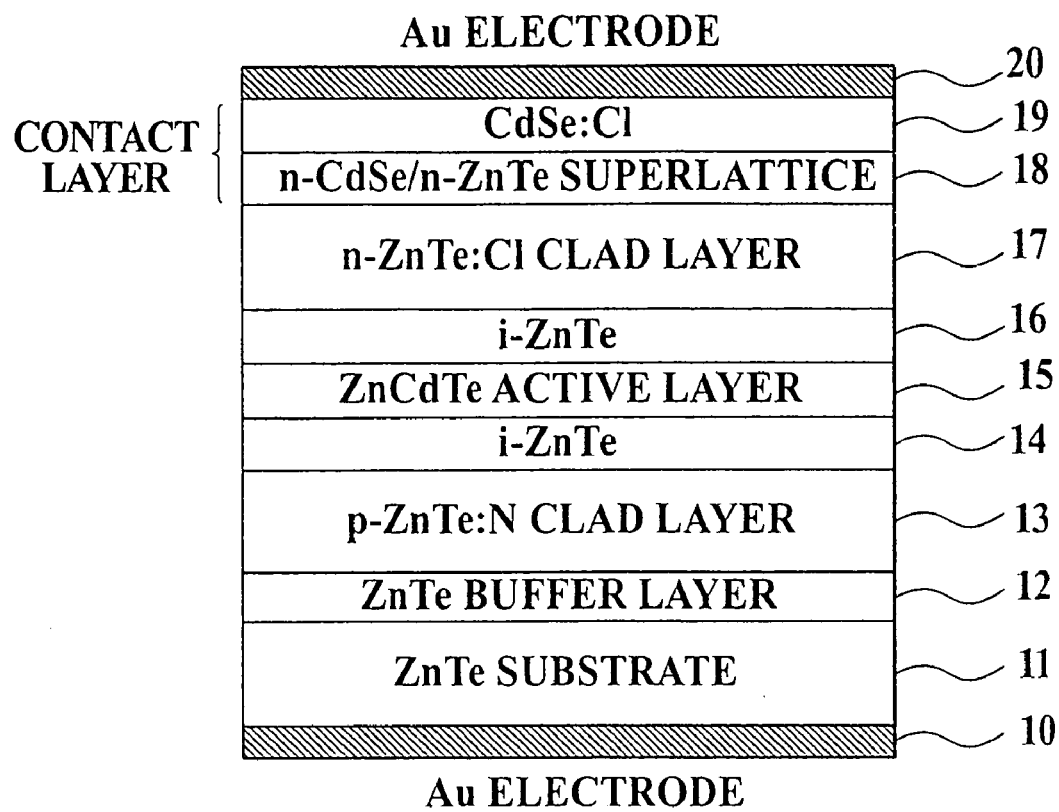
FIG. 1 is an explanatory view showing a constitution of a light-emitting diode (LED) exemplified as a photoelectric conversion device according to the present invention.

FIG. 1 is an explanatory view showing a constitution of a light-emitting diode (LED) exemplified as a photoelectric conversion device according to the present invention.

The light-emitting diode of the present embodiment comprises a semiconductor crystal, which is obtained by sequential growth on a ZnTe substrate 11 a ZnTe buffer layer 12, a p-type ZnTe clad layer 13, a ZnTe intermediate layer 14, a ZnCdTe active layer 15, a ZnTe intermediate layer 16, an n-type ZnTe clad layer 17, an n-type CdSe/n-type ZnTe superlattice layer 18, and an n-type CdSe contact layer 19; and Au electrodes 10, 20 formed on the top surface and back surface of the semiconductor crystal.

An exemplary process of fabricating the light-emitting diode having the above-described constitution carried out by the present inventors will be described below.

First, the ZnTe substrate 11 was etched using bromine-methanol solution and loaded into a molecular beam epitaxy apparatus. The surface of the substrate was first cleaned by heat treatment at 350° C. for 1 minute, and next on the ZnTe single-crystalline substrate 11 the ZnTe buffer layer 12 was grown to a thickness of 5 nm at a temperature as low as 240° C.

Next, the p-type ZnTe clad layer 13 was grown to a thickness of 500 nm. The p-type ZeTe clad layer 13 was doped with N (nitrogen) as an impurity, which was activated by plasma excitation, so as to have p-type conductivity.

Next, on the p-type ZnTe clad layer 13 the undoped ZnTe intermediate layer 14 was formed to a thickness of 50 nm, further thereon the undoped ZnCdTe active layer 15 was formed to a thickness of 10 nm, further thereon the undoped ZnTe intermediate layer 16 was formed to a thickness of 50 nm, and still further thereon the n-type ZnTe clad layer 17 was formed to a thickness of 200 nm. The n-type ZnTe clad layer 17 was doped with Cl as an impurity so as to have n-type conductivity.

Next, the CdSe/ZnTe superlattice layer 18, comprising 7 layers each of n-type CdSe layers and n-type ZnTe layers (total 14 layers) were alternately grown, was formed on the n-type ZnTe clad layer 17. Thickness of the CdSe layer herein was controlled so as to gradually increase from 0.3 nm (on the n-type ZnTe clad layer 17 side) towards 1.7 nm (on the n-type CdSe layer 19 side), while thickness of the ZnTe layer was kept constant at 2 nm.

Next, the n-type CdSe layer 19 was formed to a thickness of 50 nm on the CdSe/ZnTe superlattice layer 18, to thereby form the ZnTe compound semiconductor crystal which serves as a base material of a light-emitting diode. The n-type CdSe layer 19 herein is doped with Cl as an impurity so as to have n-type conductivity with a carrier concentration of $9 \times 10^{18}$ cm$^{-3}$ or above.

Although CdSe/ZnTe superlattice layer 18 and n-type CdSe contact layer 19 are expressed in a discriminated manner in the constitution shown in FIG. 1, the n-type CdSe layer 19 can be understood as a part of the CdSe/ZnTe superlattice layer 18, so that it can be said that the CdSe/ZnTe superlattice layer 18 composes a part of the n-type contact layer.

Figure 2:
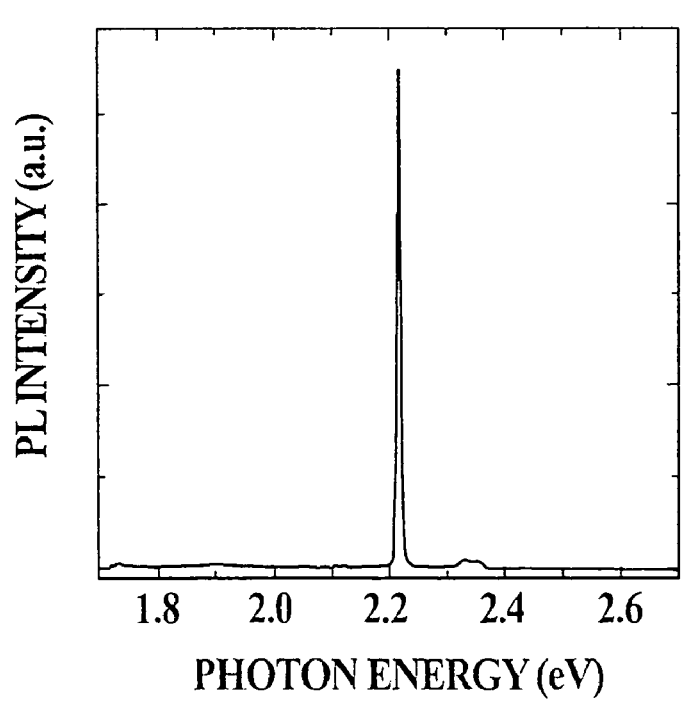
FIG. 2 is a spectral of a ZnTe compound semiconductor crystal according to the present embodiment as evaluated by the PL method.

FIG. 2 is an energy spectral of a ZnTe compound semiconductor crystal according to the present embodiment as evaluated by the photo-luminescence (PL) method, and more specifically, an energy spectral of light emitted from the ZnCdTe active layer 15 when thus-fabricated ZnTe compound semiconductor crystal was irradiated with light at a temperature of 15K.

As shown in FIG. 2, a distinct peak is observed at around 2.22 eV with a half-value width of 5.9 meV. It was thus confirmed that the ZnTe compound semiconductor crystal according to the present embodiment has an excellent quality without crystal defects, and is suitable for a base material for light-emitting diodes.

Using the foregoing ZnTe compound semiconductor crystal as a base material, Au electrodes 10, 20 were formed by vapor deposition on the top surface of the n-type CdSe layer 19 and on the back surface of the p-type ZnTe substrate, to thereby fabricate a light-emitting diode having the constitution shown in FIG. 1. It is also allowable herein to use Al or In in place of Au for forming the n-type electrode.

Figure 3:
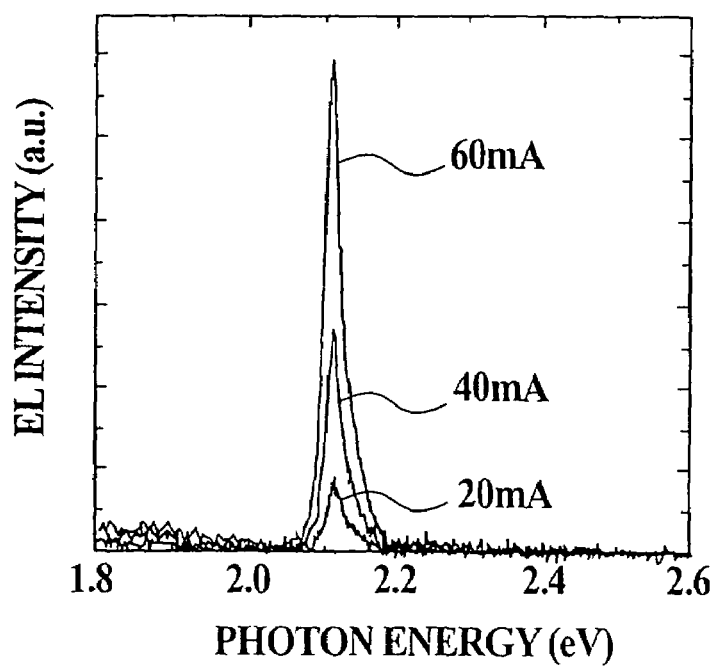
FIG. 3 is a spectral of the light-emitting diode according to the present embodiment as evaluated by the EL method.

FIG. 3 is an energy spectral chart of the light-emitting diode according to the present embodiment as evaluated by electro-luminescence (EL) method, and more specifically, an enery spectral chart of light emitted when the light-emitting diode of the present embodiment was applied with pulse currents of 20 mA, 40 mA and 60 mA (equivalent to current densities of 12 A/cm$^2$, 23 A/cm$^2$ and 35 A/cm$^2$). Each pulse current used in this experiment was a rectangular wave having a repetitive frequency of 1 kHz and a duty ratio (ratio of period during which current is turned ON) of 10%.

It is found from FIG. 3 that EL intensity increases as the current value increases. Distinct peaks were observed at around 2.11 eV irrespective of the current values, with a half-value width of 25.9 meV. The obtained light emission was a bright yellow at a wavelength of 587 nm, which was visually recognizable under room temperature.

Figure 4:
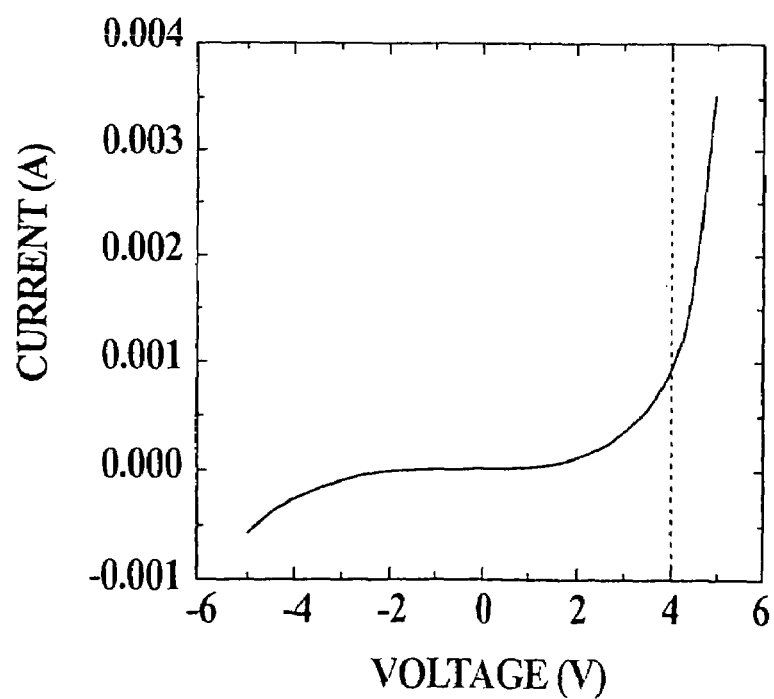
FIG. 4 is a graph showing a current-voltage characteristic of the light-emitting diode according to the present embodiment.

FIG. 4 is a current-voltage characteristic of the light-emitting diode according to the present embodiment. It is found from the figure that the light-emitting diode of the present embodiment shows a threshold voltage (voltage whereat the current starts to flow) at around 4 V. While it has been difficult for conventional light-emitting diodes using ZnTe-base compound semiconductor as a base material to be put into practical use since the threshold voltage thereof was as high as 7 V or around, the light-emitting diode according to the present embodiment was improved in the threshold voltage to as low as 4 V, which approached a level allowing the practical use.

Even 4 V might be still too high as a threshold voltage of light-emitting diode, it is expected to further lower the operation voltage by optimizing the constitution of the CdSe/ZnTe superlattice layer (thickness of the individual layers or the number of stacked layers) applied to the present embodiment.

While the present invention accomplished by the prevent inventors has been specifically explained with reference to the embodiment, the present invention is by no means limited thereto.

For example, a ZnTe compound semiconductor was used as a base material for the light-emitting diode in the present embodiment, where any compound semiconductors other than the ZnTe compound semiconductor, capable of substantially ensuring lattice matching with ZnTe are affordable of similar effects.

Although the above embodiment explained an exemplary case where a part of the n-type contact layer of ZnTe compound semiconductor layer was composed using the CdSe/ZnTe superlattice layer so as to improve the n-type contact layer, it is also allowable to compose a part of a p-type contact layer of a compound semiconductor, capable of substantially ensuring lattice matching with CdSe, using a CdSe/ZnTe superlattice layer, to thereby fabricate a CdSe-base compound semiconductor crystal having an improved p-type contact layer. A photoelectric conversion device using such CdSe-base compound semiconductor crystal as a base material can be expected to exhibit characteristics equivalent to those of the light-emitting diode of the present embodiment.

Although the above embodiment explained an exemplary case where a part of the n-type contact layer of the ZnTe compound semiconductor layer was composed using the CdSe/ZnTe superlattice layer, also use of a ZnCdSeTe composition-graded layer in place of the superlattice layer can allow the band gap to moderately incline so as to produce similar effects.

Preferable examples of the p-type impurity used for epitaxial growth of the semiconductor layer include nitrogen, phosphorus and arsenic, and those of the n-type impurity include the group III elements such as Al or the group VII elements such as Cl.

The epitaxial growth method is not limited to the molecular beam epitaxy (MBE) method, where the metal-organic chemical vapor deposition (MOCVD) process is also allowable.

Since the ZnTe-base compound semiconductor crystal was designed in the present invention so as to have, on the ZnTe-base compound semiconductor layer, the n-type contact layer which includes the superlattice layer having n-type CdSe and n-type ZnTe stacked with each other or the ZnCdSeTe-graded layer, it was made possible to raise carrier concentration of the n-type contact layer, and to control the conductivity type in a relatively easy manner even for ZnTe-base compound semiconductors for which control of the conductivity type thereof into n-type has been believed as difficult. Moreover, formation of the CdSe/ZnTe superlattice layer or the ZnCdSeTe-graded layer between the contact layer and the electrode layer can prevent electric resistance from being increased due to difference in the energy gaps. Since CdSe and ZnTe, composing the CdSe/ZnTe superlattice or ZnCdSeTe-graded layer, have relatively close lattice constants, formation thereof is less likely to adversely affect the crystallinity of the semiconductor crystal, which is advantageous in obtaining the semiconductor crystal with an excellent quality.

Therefore, the semiconductor device using such semiconductor crystal as a base material can achieve ohmic contact between the contact layer and the electrode, which successfully lowers operation voltage of the semiconductor device. In addition, by virtue of the excellent quality of the semiconductor crystal, photoelectric conversion devices, for example, can achieve excellent emission characteristics.

INDUSTRIAL APPLICABILITY

The present invention is not limited to II-VI compound semiconductor crystal and photoelectric conversion device using thereof, but is also widely applicable to any other semiconductor devices which require ohmic contact, or a low-resistance contact, between a semiconductor crystal and an electrode.

The invention claimed is:

1. A photoelectric conversion device comprising: a ZnTe-base compound semiconductor crystal having a p-n junction therein, an electrode provided on a top surface of the crystal, and an electrode provided on a back surface of the crystal; the photoelectric conversion device further comprising an n-type contact layer between an n-type semiconductor layer and an n-type electrode, wherein at least a part of the n-type contact layer comprises a superlattice layer having n-type CdSe and n-type ZnTe stacked with each other, or a ZnCdSeTe composition-graded layer.

2. A photoelectric conversion device comprising: a CdSe-base compound semiconductor crystal having a p-n junction therein, an electrode provided on a top surface of the crystal, and an electrode provided on a back surface of the crystal; the photoelectric conversion device further comprising an p-type contact layer between an p-type semiconductor layer and an p-type electrode, wherein at least a part of the p-type contact layer comprises a superlattice layer having p-type CdSe and p-type ZnTe grown with each other, or a ZnCdSeTe composition-graded layer.

* * * * *